(12) United States Patent
Ahn (10) Patent No.: US 8,253,145 B2
(45) Date of Patent: Aug. 28, 2012

(54) SEMICONDUCTOR DEVICE HAVING STRONG EXCITONIC BINDING

(75) Inventor: Doyeol Ahn, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 338 days.

(21) Appl. No.: 12/431,930

(22) Filed: Apr. 29, 2009

(65) Prior Publication Data

US 2010/0276697 A1  Nov. 4, 2010

(51) Int. Cl.
*H01L 29/15* (2006.01)
*H01L 31/0256* (2006.01)

(52) U.S. Cl. .................. 257/76; 257/14; 257/E29.102; 257/E33.037

(58) Field of Classification Search ........... 257/E29.102, 257/E33.037, 76, 14
See application file for complete search history.

(56) References Cited

U.S. PATENT DOCUMENTS

| | | | |
|---|---|---|---|
| 5,023,503 A | 6/1991 | Legge et al. | |
| 5,515,393 A | 5/1996 | Okuyama et al. | |
| 5,798,540 A | 8/1998 | Boos et al. | |
| 6,316,793 B1 | 11/2001 | Sheppard et al. | |
| 6,365,923 B1 | 4/2002 | Kamei | |
| 6,429,467 B1 | 8/2002 | Ando | |
| 6,515,308 B1 | 2/2003 | Kneissl et al. | |
| 7,745,345 B2 | 6/2010 | Horio et al. | |
| 2002/0058349 A1 | 5/2002 | Khan et al. | |
| 2002/0185655 A1 | 12/2002 | Fahimulla et al. | |
| 2004/0256611 A1 | 12/2004 | Kim et al. | |
| 2005/0121661 A1 | 6/2005 | Beach | |
| 2005/0169333 A1 | 8/2005 | Watanabe et al. | |
| 2005/0230690 A1 | 10/2005 | Hata | |
| 2006/0054888 A1 | 3/2006 | Ito et al. | |
| 2006/0078022 A1 | 4/2006 | Kozaki et al. | |
| 2006/0081873 A1* | 4/2006 | Osinsky et al. | 257/183 |
| 2006/0121682 A1 | 6/2006 | Saxler | |
| 2007/0018198 A1 | 1/2007 | Brandes et al. | |
| 2007/0138464 A1 | 6/2007 | Van de Walle et al. | |
| 2007/0194354 A1 | 8/2007 | Wu et al. | |

(Continued)

FOREIGN PATENT DOCUMENTS

JP  2005-277357 A  10/2005

(Continued)

OTHER PUBLICATIONS

Seoung-Hwan Park, et al., "Many-body optical gain of wurtzite GaN-based quantum-well lasers and comparison with experiment", Appl. Phys. Lett 72(3), Jan. 19, 1997, 287-289, 1998 American Institute of Physics.

(Continued)

*Primary Examiner* — Matthew Landau
*Assistant Examiner* — Daniel Luke
(74) *Attorney, Agent, or Firm* — Workman Nydegger (57) ABSTRACT

Semiconductor devices having strong excitonic binding are disclosed. In some embodiments, a semiconductor device includes at least one active layer composed of a first compound, and at least one barrier layer composed of a second compound and disposed on at least one surface of the at least one active layer. An energy band gap of the at least one barrier layer is wider than energy band gap of the at least one active layer, and the first and/or second compounds are selected to strengthen an excitonic binding between an electron and a hole in the at least one active layer.

12 Claims, 6 Drawing Sheets

U.S. PATENT DOCUMENTS

| | | | |
|---|---|---|---|
| 2008/0054303 | A1 | 3/2008 | Beach |
| 2009/0034568 | A1 | 2/2009 | Nakahara et al. |
| 2010/0102359 | A1 | 4/2010 | Khan et al. |
| 2010/0270547 | A1 | 10/2010 | Ahn |
| 2010/0270591 | A1 | 10/2010 | Ahn |
| 2010/0270592 | A1 | 10/2010 | Ahn |
| 2010/0276730 | A1 | 11/2010 | Ahn |
| 2010/0327278 | A1 | 12/2010 | Ahn |

FOREIGN PATENT DOCUMENTS

| | | |
|---|---|---|
| KR | 1995-0007490 B1 | 7/1995 |
| KR | 10-0865740 B1 | 10/2008 |

OTHER PUBLICATIONS

Seoung-Hwan Park, et al., "Piezoelectric effects on electrical and optical properties of wurtzite GaN/AlGaN quantum well lasers", Appl. Phys Lett., vol. 72. No. 24., Jun. 15, 1998, 3103-3015, 1998 American Institute of Physics.

Seoung-Hwan Park, et al., "Many-body optical gain and intraband relaxation time of wurtzite InGaN/GaN quantum-well lasers and comparison with experiment", Appl. Phys. Lett. 87, Jul. 20, 2005, 044103-1-044103-3, , 2005 American Institute of Physics.

Seoung-Hwan Park, et al., Spontaneous and piezoelectric polarizntion effects in wurtzite ZnO/MgZnO quantum well lasers:, Appl. Phys. Lett. 87., Dec. 15, 2005, 253509-1-203509-3. 2005 American Institute of Physics.

Seoung-Hwan Park, et al., "Internal field engineering in CdZnO/MgZnO quantum well structures", Appl. Phys. Lett 94, Feb. 27, 2009, 083507-1-083507-3, 2009 American Institute of Physics.

Seoung-Hwan Park, et al., "Optical gain in InGaN/InGaAlN quantum well structures with zero internal field", Appl. Phys. Lett., 92, May 2, 2008, 171115-1-171115-3, 2008 American Institute of Physics.

Bradley. et al.. "Space-charge effects in type- II strained layer superlattices", 1998, 728-731, Elsevier Science.

Liu, et al., "AlGaN/GaN/InGaN/GaN DH-HEMTs With an InGaN Notch for Enhanced Carrier Confinement", IEEE Electron Device Letters, vol. 27. No. 1., Jan. 10-12, 2006, 2005 IEEE.

Doyeol, et al., "Theory of Non-Markovian Gain in Strained-Layer Quantum-Well Lasers with Many-Body Effects", IEE Journal of Quantum Electronics, vol. 34. No. 2. Feb. 1998, 344-352, 2005 IEEE.

D. Ahn, et al., "Optical Gain and Luminescence of a ZnO-MgZnO Quantum Well", IEEE Photonics Technology Letters, vol. 18. No. 2., Jan. 15, 2006, 349-351, 2005 IEEE.

Doyeol Ahn "Non-Markovian Gain of Strained-Layer Wurtzite GaN Quantum-Well Lasers with Many-Body Effects", IEEE Journal of Selected Topics in Quantum Electronics. vol. 4, No. 3, May/Jun. 1998, 520-526, 1998 IEEE.

Yifei Zhang, et al., "Charge control and mobility studies for an AlGaN/GaN high electron mobility transistor", Journal of Applied Physics, vol. 85, No. 1. Jan. 1, 1999, 587-594, 1999 American Institute of Physics.

Tsung-Hsing Yu, et al., "Theoretical study of the two-dimensional electron mobility in strained III-nitride heterostructures", Journal of Applied Physics, vol. 89, No. 7, Apr. 1, 2001, 3827-3833, 2001 American Institute of Physics.

Seoung-Hwan Park, "Crystal Orientation Effects on Electronic Properties of Wurtzite GaN/AlGaN Quantum Wells with Spontaneous and Piezoelectric Polarization", Jpn. J. Appl. Phys. vol. 39., Jun. 2000, 3478-3482, 2000 The Japan Society of Applied Phtsics.

P. Waltereit, et al., "Nitride semiconductors free of electrostatic fields for efficient white light-emitting diodes", Nature vol. 406, Aug. 24, 2000, 865-868, 2000 Macmillan Magazines Ltd.

D. Ahn, et al., "Electric field dependence of intrasubband polar-optical-phonon scattering in a quantum well", Physical Review B, Feb. 15, 1988, 2529-2535, 1998 The American Physical Society.

Doyeol Ahn, "Time-convolutionless reduced-density-operator theory of an arbitrary driven system coupled to a stochastic reservoir: Quantum kinetic equations for semiconductors", Physical Review B, Sep. 15, 1994, 8310-8318, 1994 The American Physical Society.

Doyeol Ahn, "Time-convolutionless reduced-density-operator theory of an arbitrary driven system coupled to a stochastic reservoir. II . Optical gain and line-shape function of a driven semiconductor", Physical Review B. Jan. 15, 1995, 2159-2166, 1995 The American Physical Society.

Seoung-Hwan Park, et al., "Crystal-Orientation effects on the piezoelectric field and electronic properties of strained wurtzite semiconductors", Physical Review B, Feb. 15, 1999, 4725-4737, 1999 The Japan Society of Applied Phtsics.

Zimmerman et al., Piezoelectric GaN Sensor Structures, IEEE Electron Device Letters, vol. 27, No. 5, pp. 309-312, May 5, 2006.

Davies et al., Fabrication of GaN Cantilevers on Silicon Substrates for Microelectromechanical Devices, Applied Physics Letters, vol. 84, No. 14, pp. 2566-2568, Apr. 5, 2004.

Chu et al., Piezoelectric Polarization-Induced Two Dimensional Electron Gases in AlGaN/GaN Heteroepitaxial Structures: Application for Micro-Pressure Sensors, Materials Science and Engineering A, vol. 409, pp. 340-347, Nov. 2005.

A.D. Andreev et al., "Strain distributions in quantum dots of arbitrary shape," Journal of Applied Physics, vol. 86, No. 1, Jul. 1, 1999, pp. 297-305.

P. H. Dederichs, "Elastic Green's Function for Anisotropic Cubic Crystals," Physical Review, vol. 188, No. 3, Dec. 15, 1969, pp. 1175-1183.

International Search Report and Written Opinion, mailed Aug. 25, 2010, as issued in connection with Patent Application No. PCT/KR2010/002648 filed on Apr. 27, 2010.

International Search Report and Written Opinion, mailed Aug. 26, 2010, as issued in connection with Patent Application No. PCT/KR2010/002652 filed on Apr. 27, 2010.

Crosslight Software Inc., "BeamXpress", Newsletter, Mar. 2000, 1-12, Issue No. 2000.3, Crosslight Software Inc., www.crosslight.com.

Makino, et al. "Band gap engineering based on $Mg_xZn_{1-x}O$ and $Cd_yZn_{1-y}O$ ternary alloy films". Appl. Phys. Lett. 78, 1237 (2001); doi:10.1063/1.1350632.

U.S. Appl. No. 12/430,331, Mar. 24, 2011, Office Action.
U.S. Appl. No. 12/430,331, Aug. 23, 2011, Office Action.
U.S. Appl. No. 12/430,406, May 2, 2011, Office Action.
U.S. Appl. No. 12/430,406, Sep. 9, 2011, Office Action.
U.S. Appl. No. 12/430,424, Mar. 28, 2011, Office Action.
U.S. Appl. No. 12/430,424, Dec. 15, 2011, Office Action.
U.S. Appl. No. 12/431,921, Apr. 1, 2011, Office Action.
U.S. Appl. No. 12/431,921, Oct. 27, 2011, Office Action.
U.S. Appl. No. 12/494,056, Apr. 18, 2011, Office Action.
U.S. Appl. No. 12/494,056, Oct. 27, 2011, Office Action.

* cited by examiner

SEMICONDUCTOR DEVICE HAVING STRONG EXCITONIC BINDING

CROSS REFERENCE TO RELATED APPLICATION

This application is related to the following:

U.S. Patent application Ser. No. 12/430,331 filed Apr. 27, 2009,

U.S. Patent application Ser. No. 12/430,371 filed Apr. 27, 2009,

U.S. Patent application Ser. No. 12/431,921 filed Apr. 29, 2009,

U.S. Patent application Ser. No. 12/430,406 filed Apr. 27, 2009,

U.S. Patent application Ser. No. 12/430,424 filed Apr. 27, 2009, and

U.S. Patent application Ser. No. 12/494,056 filed Jun. 29, 2009.

BACKGROUND

Group I-VII compound semiconductors have particularly wide band gaps and are capable of emitting typically green or blue light. Recently semiconductor devices, such as, photoelectric conversion devices using I-VII group compound semiconductor crystals as base materials have been developed to improve efficiency and life time of semiconductor devices.

However, one drawback to Group I-VII compound semiconductors is their poor optical gain characteristics.

SUMMARY

In one embodiment, a semiconductor device includes at least one active layer composed of a first compound, and at least one barrier layer composed of a second compound and disposed on at least one surface of the at least one active layer. An energy band gap of the at least one barrier layer is wider than energy band gap of the at least one active layer, and the first and/or second compounds are selected to strengthen an excitonic binding between an electron and a hole in the at least one active layer.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In one embodiment, a semiconductor device includes at least one active layer composed of a first compound, and at least one barrier layer composed of a second compound and disposed on at least one surface of the at least one active layer. An energy band gap of the at least one barrier layer can be wider than an energy band gap of the at least one active layer. The first and/or second compounds can be selected to strengthen an excitonic binding between an electron and a hole in the at least one active layer.

The excitonic binding can be strengthened by reducing an internal polarization field in the at least one active layer. Further, the internal polarization field can be reduced by making a sum of piezoelectric and spontaneous polarizations in the at least one active layer and a sum of piezoelectric and spontaneous polarizations in the at least one barrier layer substantially the same to reduce the internal polarization field.

Each of the first and second compounds can include a I-VII group compound semiconductor material. The first compound can include, for example, CuF, CuCl, CuBr, CuI, AgF, AgCl, AgBr, AgI, AuF, AuCl, AuBr, AuI, CuFCl, CuBrF, CuFI, CuClBr, CuClI, CuBrI, AgFCl, AgFBr, AgFI, AgClBr, AgClI, AgBrI, AuFCl, AuFBr, AuFI, AuClBr, AuClI, AuBrI, CuFClBr, CuFClI, CuFBrI, CuIBrCl, AgFClBr, AgFClI, AgFBrI, AgClBrI, AuFClBr, AuFClI, AuFBrI, or AuClBrI. The second compound can include, for example, CuFCl, CuBrF, CuFI, CuClBr, CuClI, CuBrI, AgFCl, AgFBr, AgFI, AgClBr, AgClI, AgBrI, AuFCl, AuFBr, AuFI, AuClBr, AuClI, AuBrI, CuFClBr, CuFClI, CuFBrI, CuIBrCl, AgFClBr, AgFClI, AgFBrI, AgClBrI, AuFClBr, AuFClI, AuFBrI, or AuClBrI.

In some embodiments, the first compound can include $CuBr_xF_{1-x}$ ($0 \leq x \leq 1$) and the second compound can include $CuI_{y1}Br_{1-y1-y2}Cl_{y2}$ ($0 \leq y1+y2 \leq 1$). Variable x can be in the range of about 0.03 and 0.5, variable y1 can be in the range of about 0.01 to 0.4, and variable y2 can be in the range of about 0.2 and 0.35.

In some embodiments, the at least one active layer can have a thickness of about 0.1 nm to 300 nm, and the at least one barrier layer can have a thickness of about 0.1 nm to 500 nm. Further, the energy band gap of the at least one active layer can be in the range of about 0.7 eV and 3.4 eV, and the energy band gap of the at least one barrier layer can be in the range of about 0.7 eV and 6.3 eV. Still further, an optical gain of the semiconductor device can be substantially identical to or greater than about 8,000/cm.

In another embodiment, a method for fabricating a semiconductor device includes forming at least one active layer composed of a first compound on a substrate, and forming at least one barrier layer composed of a second compound on at least one surface of the at least one active layer. An energy band gap of the at least one barrier layer can be wider than an energy band gap of the at least one active layer. The compositions of the first and/or second compounds can be adjusted to strengthen an excitonic binding between an electron and a hole in the at least one active layer.

In some embodiments, when the first compound includes $CuBr_xF_{1-x}$ and the second compound includes $CuI_{y1}Br_{1-y1-y2}Cl_{y2}$, the compositions of the first and/or second compounds can be adjusted by controlling variable x in the range of 0 and 1, and a sum of variables y1 and y2 in the range of 0 and 1. Further, the at least one active layer and/or the at least one barrier layer can be formed by employing radio-frequency (RF) magnetron sputtering, pulsed laser deposition, metal organic chemical vapor deposition (MOCVD), molecular beam epitaxy, or radio-frequency plasma-excited molecular beam epitaxy. Still further, the compositions of the first and/or second compounds can be adjusted by controlling an amount of precursor gases or by controlling a processing temperature or processing time to strengthen the excitonic binding.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Figure 1A:
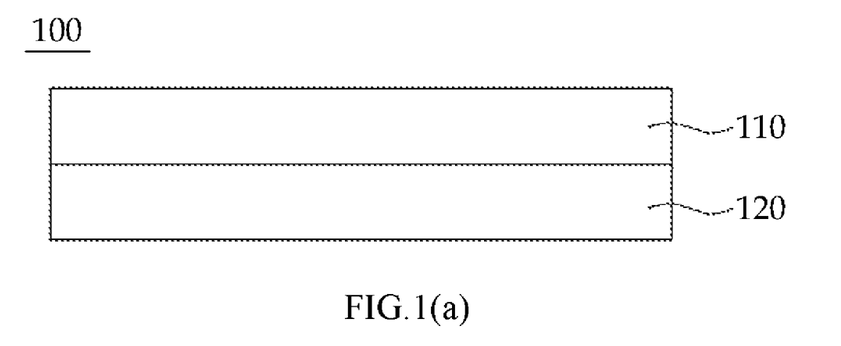
FIGS. 1(a) and (b) are schematic diagrams of an illustrative embodiment of a semiconductor device.

FIGS. 1(a) and (b) are schematic diagrams of an illustrative embodiment of a semiconductor device. FIGS. 2(a) and (b) are schematic diagrams showing band gaps of the semiconductor device of FIG. 1.

As depicted in FIG. 1(a), a semiconductor device 100 may have a single heterostructure in which a barrier layer 110 is disposed on one surface (e.g. a top surface) of an active layer 120. Barrier layer 110 has a wider band gap that is wider than the band gap of active layer 120. For example, as depicted in FIG. 2(a), a band gap ($E_{g,active\ layer}$) 220 of active layer 120 is lower than a band gap ($E_{g,barrier\ layer}$) 210 of barrier layer 110, so that a quantum well 240 is formed in active layer 120. $E_{g,active\ layer}$ is the difference between $E_c$ and $E_v$ at active layer 120, and $E_{g,barrier\ layer}$ is the difference between $E_c$ and $E_v$ at barrier layer 110. $E_c$ refers to an energy level at a conduction band of a semiconductor material, for example, a I-VII group compound semiconductor. $E_v$ refers to an energy level at a valence band of a semiconductor material, such as I-VII group compound without limitation. Quantum well 240 is a potential well which can confine carriers, such as electrons or holes, in a dimension perpendicular to a surface of active layer 120. Due to the band gap differences between active layer 120 and barrier layer 110, particles, such as electrons or holes can be confined in quantum well 240.

Figure 1B:
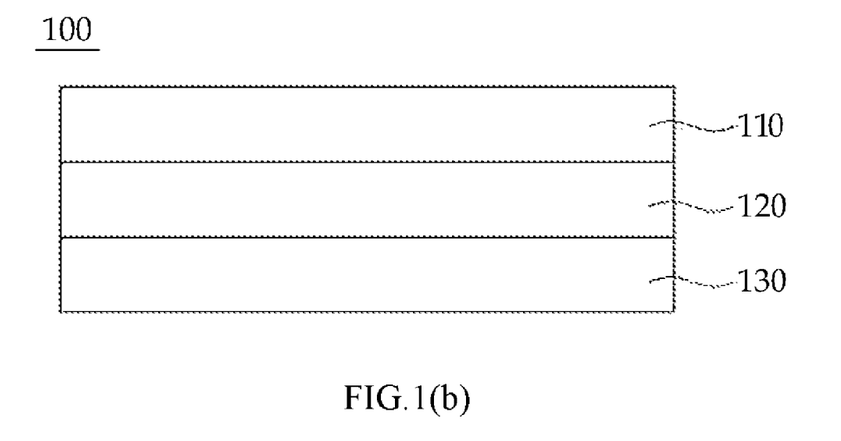
Figure 2A:
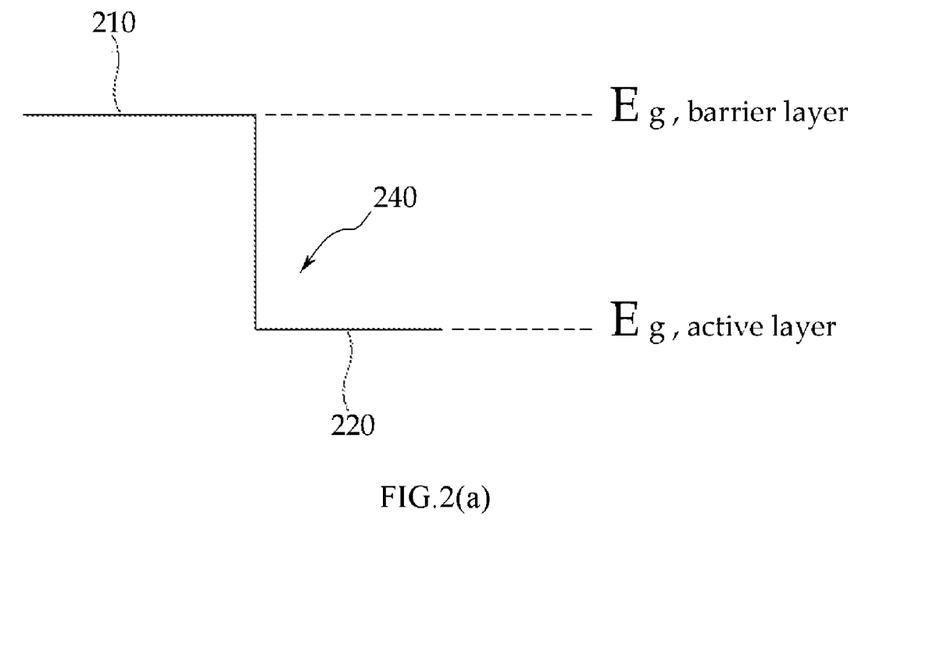
FIGS. 2(a) and (b) are schematic diagrams showing band gaps of the semiconductor devices of FIG. 1.
Figure 2B:
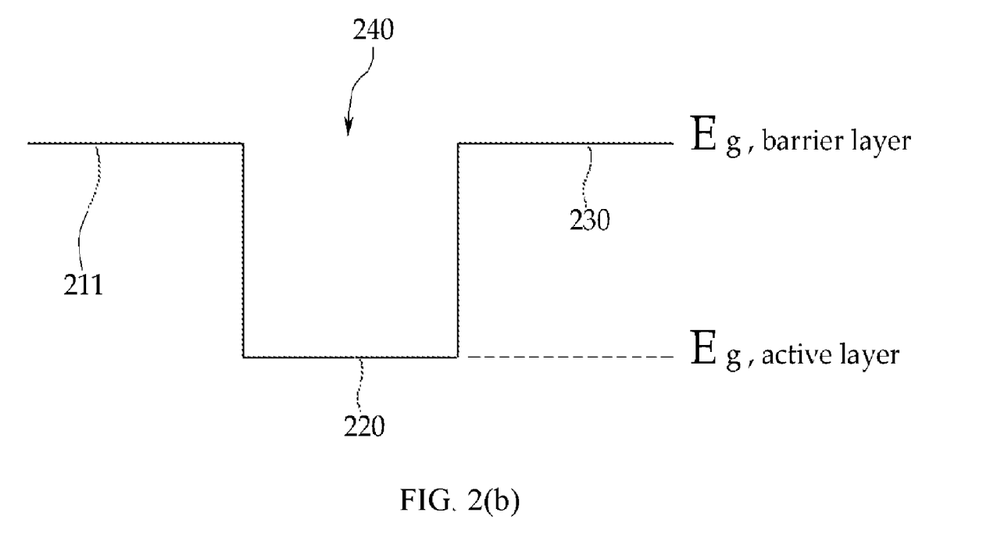

As depicted in FIG. 1(b), semiconductor device 100 may optionally have a second barrier layer (e.g., a barrier layer 130), and thus form a double heterostructure. For example, semiconductor device 100 may have active layer 120, barrier layer 110 disposed on one surface (e.g., a top surface) of active layer 120, and barrier layer 130 disposed on the other surface (e.g., a bottom surface) of active layer 120. For the purpose of illustration, barrier layers 110 and 130 are hereinafter referred as upper barrier layer 110 and lower barrier layer 130. Each of upper and lower barrier layers 110 and 130 has a wider band gap than that of active layer 120. A quantum well 240 is formed in active layer 120 because band gap ($E_{g,active\ layer}$) 220 of active layer 120 is narrower than band gaps ($E_{g,upper\ barrier\ layer}$) 211 and ($E_{g,lower\ barrier\ layer}$) 230 of upper and lower barrier layers 110 and 130, as depicted in FIG. 2(b).

Active layer 120 may be composed of a I-VII group compound semiconductor material. For example, I-VII group compound semiconductor materials of active layer 120 include, without limitation, CuF, CuCl, CuBr, CuI, AgF, AgCl, AgBr, AgI, AuF, AuCl, AuBr, AuI, CuFCl, CuBrF, CuFI, CuClBr, CuClI, CuBrI, AgFCl, AgFBr, AgFI, AgClBr, AgClI, AgBrI, AuFCl, AuFBr, AuFI, AuClBr, AuClI, AuBrI, CuFClBr, CuFClI, CuFBrI, CuFCII, CuFBrI, CuIBrCl, AgFClBr, AgFClI, AgFBrI, AgClBrI, AuFClBr, AuFClI, AuFBrI, or AuClBrI. Each of upper and lower barrier layers 110 and 130 may be also composed of a I-VII group compound semiconductor material. In some embodiments, each of upper barrier layer 110 and lower barrier layer 130 may also be composed of a ternary compound semiconductor material or a quaternary compound semiconductor material. The ternary or quaternary compound semiconductor material in each of upper barrier layer 110 and lower barrier layer 130 may include, without limitation, CuFCl, CuBrF, CuFI, CuClBr, CuClI, CuBrI, AgFCl, AgFBr, AgFI, AgClBr, AgClI, AgBrI, AuFCl, AuFBr, AuFI, AuClBr, AuClI, AuBrI, CuFClBr, CuFClI, CuFBrI, CuIBrCl, AgFClBr, AgFClI, AgFBrI, AgClBrI, AuFClBr, AuFClI, AuFBrI, or AuClBrI.

In other embodiments, semiconductor device 100 can have two or more active layers and two or more barrier layers. For example, the two or more active layers and the two or more barrier layers can be sequentially deposited to form a sandwiched configuration in which an active layer is sandwiched with two barrier layers.

A quantum efficiency is a quantity defined as the percentage of photons that produces an electron-hole pair, and can be measured by, for example, an optical gain of semiconductor device 100. When an excitonic binding energy of electron-hole pairs is strong, the optical gain of semiconductor device 100 is enhanced. The excitonic binding decreases with the increase of an internal polarization field in active layer 120 of semiconductor device 100 because the internal polarization field increases the separation between electrons and holes. In turn, the optical gain can be enhanced by reducing the internal polarization field, that is, by strengthening the excitonic binding of electron-hole pairs.

The optical gain $g(\omega)$ can be calculated by using a non-Markovian model with many-body effects due to interband transitions. In some examples, the "many-body effects" refer to a band gap renormalization and an enhancement of optical gain due to attractive electron-hole interaction (Coulomb or excitonic enhancement). The optical gain $g(\omega)$ is given by Equation (1) as below. For theory on the optical gain, see Doyeol Ahn, "Theory of Non-Markovian Gain in Strained-Layer Quantum-Well Lasers with Many-Body Effects", IEEE Journal of Quantum Electronics, Vol. 34, No. 2, p. 344-352 (1998), and Ahn et al., "Many-Body Optical Gain and Intraband Relaxation Time of Wurtzite InGaN/GaN Quantum-Well Lasers and Comparison with Experiment", Appl. Phys. Lett. Vol. 87, p. 044103 (2005), which are incorporated by references herein in their entireties.

$$g(\omega) = \frac{\omega \mu c}{n_r V} \sum_{\sigma \eta lm} \sum_{\vec{k}_{\parallel}} |\hat{e} \cdot M_{lm}^{\eta \sigma}(\vec{k}_{\parallel})|^2 (f_c - f_{h\sigma}) C_{lm}^{\eta \sigma}(\vec{k}_{\parallel}) \quad \text{Equation (1)}$$

where $\omega$ is an angular frequency of a photon in active layer 120; $\mu$ is a vacuum permeability; $n_r$ is a refractive index of active layer 120; c is a speed of light in free space; V is a volume of active layer 120; $f_c$ and $f_{h\sigma}$ are Fermi functions for a conduction band and a valence band of 3×3 block Hamiltonian H°, respectively; $M_{lm}^{\eta \sigma}(\vec{k}_{\parallel})$ is a dipole matrix element between the conduction band with a spin state $\eta$ and the valence band of a 3×3 block Hamiltonian H°; $\hat{e}$ is an unit vector in the direction of a photon polarization; and $C_{lm}^{\eta \sigma}(\vec{k}_{\parallel})$ is a renormalized lineshape function.

As shown in Equation (1) above, the optical gain $g(\omega)$ increases in accordance with the increase of an optical dipole matrix element $M_{lm}^{\eta \sigma}(\vec{k}_{\parallel})$ in quantum well 240. The optical dipole matrix element $M_{lm}^{\eta \sigma}(\vec{k}_{\parallel})$ increases as the degree of the electron-hole separation becomes reduced. Further, the degree of the electron-hole separation reduces as the internal polarization field decreases. Accordingly, the optical dipole matrix element $M_{lm}^{\eta\sigma}(\vec{k}_{\parallel})$ can be largely enhanced due to disappearance of the internal polarization field. For additional detail on the relationship between the optical dipole matrix element and the internal polarization filed, see Ahn et al., "Optical Gain in InGaN/InGaAlN Quantum Well Structures with Zero Internal Field", Appl. Phys. Lett. Vol. 92, p. 171115 (2008), which is incorporated by reference herein in its entirety.

In Equation (1) above, the renormalized lineshape function $C_{lm}^{\eta\sigma}(\vec{k}_{\parallel})$ is presented by Equation (2) below:

$$C_{lm}^{\eta\sigma}(\vec{k}_{\parallel}) = \frac{1 + \mathrm{Re}g_2(\infty, \Delta_{lm}^{\eta\sigma}(\vec{k}_{\parallel}))}{(1 - \mathrm{Re}q_{lm}^{\eta\sigma}(\vec{k}_{\parallel}))^2 + (\mathrm{Im}q_{lm}^{\eta\sigma}(\vec{k}_{\parallel}))^2} \times \left\{ \mathrm{Re}\Xi_{lm}^{\eta\sigma}(0, \Delta_{lm}^{\eta\sigma}(\vec{k}_{\parallel}))(1 - \mathrm{Re}q_{lm}^{\eta\sigma}(\vec{k}_{\parallel})), -\mathrm{Im}\Xi_{lm}^{\eta\sigma}(0, \Delta_{lm}^{\eta\sigma}(\vec{k}_{\parallel}))\mathrm{Im}q_{lm}^{\eta\sigma}(\vec{k}_{\parallel}) \right\}$$

Equation (2)

where the function $g_2$ is presented by the Equation (3) below.

$$g_2(t, \Delta_k) = \int_0^t d\tau \int_0^\tau ds \exp\{i\Delta_k s\} \cdot \left\{ \langle (vk[H_i(t)(U_\sigma(\tau)H_i(t-\tau))]|vk) \rangle_i + \langle (ck|[U_\sigma(\tau)H_i(t-\tau))H_i(t)]|ck) \rangle_i \right\}$$

Equation (3)

where $\vec{k}_{\parallel}$ is an in-plane wave vector, $\mathrm{Re}q_{lm}^{\eta\sigma}(\vec{k}_{\parallel})$ and $\mathrm{Im}q_{lm}^{\eta\sigma}(\vec{k}_{\parallel})$ are real and imaginary parts of Coulomb interaction between an electron in the conduction band with a spin state $\eta$ and a hole in the valence band of 3×3 block Hamiltonian $H^\circ$ in the presence of photon fields, respectively. $\mathrm{Re}\mu_{lm}^{\eta\sigma}(0,\Delta_{lm}^{\eta\sigma}(\vec{k}_{\parallel}))$ and $\mathrm{Im}\mu_{lm}^{e\sigma}(0,\Delta_{lm}^{\eta\sigma}(\vec{k}_{\parallel}))$ are the real and imaginary parts of the non-Markovian lineshape.

The real and imaginary parts of the non-Markovian lineshape are presented by Equations (4) and (5) below, respectively:

$$\mathrm{Re}\Xi_{lm}^{\eta\sigma}(0, \Delta_{lm}^{\eta\sigma}(\vec{k}_{\parallel})) = \sqrt{\frac{\pi\tau_{in}(\vec{k}_{\parallel}, \hbar\omega)\tau_c}{2\hbar^2}} \exp\left(-\frac{\tau_{in}(\vec{k}_{\parallel}, \hbar\omega)\tau_c}{2\hbar^2}\Delta_{lm}^{\eta\sigma}(\vec{k}_{\parallel})^2\right)$$

Equation (4)

and $$\mathrm{Im}\Xi_{lm}^{\eta\sigma}(0, \Delta_{lm}^{\eta\sigma}(\vec{k}_{\parallel})) = \frac{\tau_c}{\hbar}\int_0^\infty \exp\left(-\frac{\tau_c}{2\tau_{in}(\vec{k}_{\parallel}, \hbar\omega)}t^2\right)\sin\left(\frac{\Delta_{lm}^{\eta\sigma}(\vec{k}_{\parallel})\tau_c}{\hbar}t\right)$$

Equation (5)

where $\tau_{in}$ is relaxation time of carriers, and $\tau_c$ is correlation time for intraband process.

As shown in Equations (4) and (5) above, the abstract values of the real and imaginary parts of the non-Markovian lineshape $\mathrm{Re}\mu_{lm}^{\eta\sigma}(0,\Delta_{lm}^{\eta\sigma}(\vec{k}_{\parallel}))$ and $\mathrm{Im}\mu_{lm}^{e\sigma}(0,\Delta_{lm}^{\eta\sigma}(\vec{k}_{\parallel}))$ increase as the relaxation time $\tau_{in}$ increases. Thus, since the renormalized lineshape function $C_{lm}^{\eta\sigma}(\vec{k}_{\parallel})$ decreases when the non-Markovian lineshape increases according to the Equation (3) above, it decreases as the relaxation time increases. Accordingly, the optical gain $g(\omega)$ decreases as the relaxation time $\tau_{in}$ increases according to Equation (1) above.

Here, the relaxation time refers to the time period during which a carrier, such as an electron or hole, transits from a steady state to an equilibrium state. A carrier emits energy in the form of, for example, light, corresponding to the band gap between the steady state and the equilibrium state in quantum well 240 while the carrier undergoes the transition. Thus, for the same band gap between the steady state and the equilibrium state, as the relaxation time $\tau_{in}$ decreases, an amount of the emitted energy per a time unit increases. Accordingly, the optical gain $g(\omega)$ will increase.

Figure 3A:
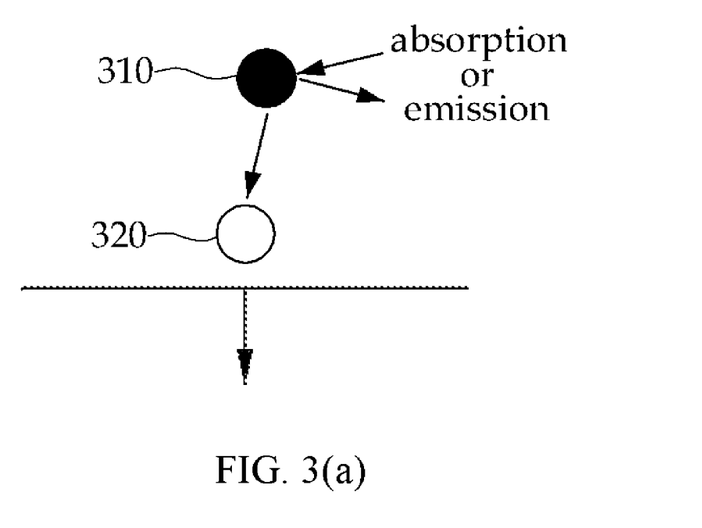
FIGS. 3(a) and (b) are schematic diagrams illustrating an electron-phonon scattering and a carrier-carrier scattering, respectively.
Figure 3B:
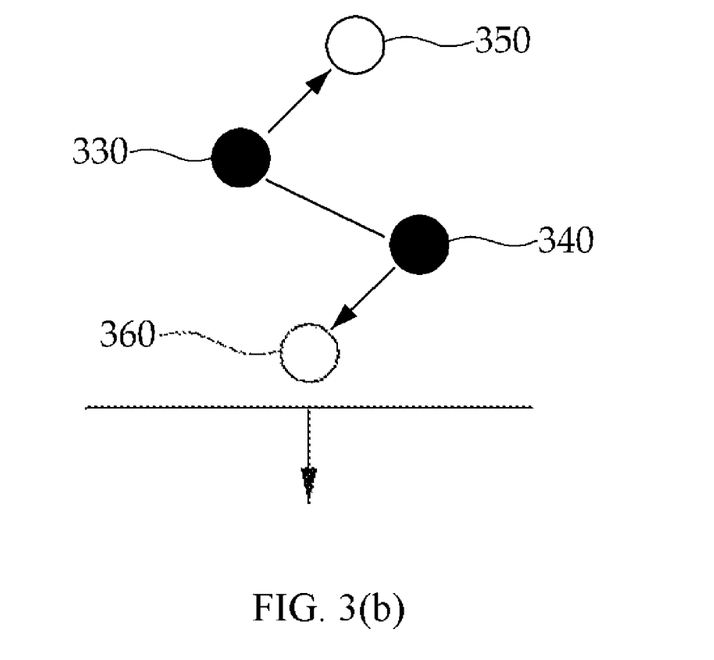

The relaxation time is related to an electron-phonon scattering and a carrier-carrier scattering in quantum well 240. FIGS. 3(a) and (b) show schematic diagrams illustrating an electron-phonon scattering and a carrier-carrier scattering, respectively. In some examples, the electron-phonon scattering refers to a situation where a hole 320 is scattered due to the emission or absorption of phonon from or into an electron 310 (FIG. 3(a)). The carrier-carrier scattering refers to a situation where two electrons 330 and 340 collide and each scatter toward two holes 350 and 360. As the scattering increases, the relaxation time $\tau_{in}$ increases because the excited electrons and holes less frequently collide.

The scatterings are related to an intensity of an internal polarization field in quantum well 240. For example, when the internal polarization field exists in quantum well 240, it pushes electrons or holes to a wall of quantum well 240. Thus the effective well width is reduced, and the reduction results in the enhancement of the scattering rate. Accordingly, if the internal polarization field in quantum well 240 is reduced, the scattering rate can be decreased, and thus the relaxation time $\tau_{in}$ can be decreased. As explained above, this results in the enhancement of the optical gain of quantum well 240.

As shown in Equation (1) above, the optical gain $g(\omega)$ is proportional to the difference between Fermi functions for conduction band and valence band of 3×3 block Hamiltonian $H^\circ$, i.e. ($f_c$-$f_{h\sigma}$). The Fermi function difference ($f_c$-$f_{h\sigma}$) relates to separation of a quasi-Fermi level at steady state. The quasi Fermi level describes a new Fermi level that each type of charge carriers, such as electrons and holes in a semiconductor device appears to share when their populations are displaced from equilibrium. This displacement could be caused by the application of an electric potential, such as the electric potential caused by the internal polarization field existing in active layer 120 of semiconductor device 100. This displacement causes the Fermi function difference ($f_c$-$f_{h\sigma}$) to be decreased. Accordingly, the Fermi function difference ($f_c$-$f_{h\sigma}$) decreases as the internal polarization field increases. In turn, the term ($f_c$-$f_{h\sigma}$) in Equation (1) is enhanced when the internal polarization field is decreased.

As described above, the reduction of the internal polarization field causes the enhancement of the optical dipole matrix element, the decrease of the relaxation time of carriers, and the increase of the Fermi function difference in active layer 120. Thus, the distance between electrons and holes in active layer 120 of semiconductor device 100 can be shortened. As the electrons and holes become closer, the excitonic binding of electron-hole pairs in active layer 120 is increased and thus the optical gain of semiconductor device 100 is enhanced. Accordingly, the optical gain of semiconductor device 100 can be enhanced by reducing the internal polarization field in active layer 120.

The internal polarization field in quantum well 240 arises from a spontaneous polarization $P_{SP}$ and a piezoelectric polarization $P_{PZ}$. Spontaneous polarization $P_{SP}$ refers to polarization that arises in ferroelectrics without an external electric field. Piezoelectric polarization $P_{PZ}$ refers to polarization that arises from electric potential generated in response to applied mechanical stress such as strain of a layer. Although $P_{PZ}$ alone can be reduced by the reduction of the strain, $P_{SP}$ still remains in quantum well 240. For additional detail on spontaneous and piezoelectric polarizations $P_{SP}$ and $P_{PZ}$ and the internal polarization field, see Ahn et al., "Spontaneous and piezoelectric polarization effects in wurtzite ZnO/MgZnO quantum well lasers," Appl. Phys. Lett. Vol. 87, p. 253509 (2005), which is incorporated by reference herein in its entirety.

Thus, the excitonic binding of electron-hole pairs is strengthened and thus the optical gain $g(\omega)$ is increased when a total internal polarization field, which includes spontaneous and piezoelectric polarizations $P_{SP}$ and $P_{PZ}$, is reduced. The total internal polarization field $F_z^w$ in quantum well 240 can be determined from the difference between the sum of $P_{SP}$ and $P_{PZ}$ in quantum well 240 and the sum of $P_{SP}$ and $P_{PZ}$ in upper and lower barrier layers 110 and 130. Thus, internal polarization filed $F_z^w$ can be presented by Equation (6) below.

$$F_z^W = [(P_{SP}^b + P_{PZ}^b) - (P_{SP}^w + P_{PZ}^w)] / (\in^w + \in^b L_w/L_b) \quad \text{Equation (6)}$$

where P is the polarization, the superscripts w and b denote quantum well 240 and upper and lower barrier layers 110 and 130 respectively, L is a thickness of quantum well 240 and upper and lower barrier layers 110 and 130, and $\in$ is a static dielectric constant.

In accordance with one example, the internal polarization field can have a value of zero by making the sum $(P_{SP}^b + P_{PZ}^b)$ of spontaneous and piezoelectric polarizations at upper and lower barrier layers 110 and 130 and the sum $(P_{SP}^w + P_{PZ}^w)$ of spontaneous and piezoelectric polarizations at quantum well 240 the same. For example, this can be achieved by controlling the mole fractions of the compounds in upper and lower barrier layers 110 and 130 and/or active layer 120.

Figure 4:
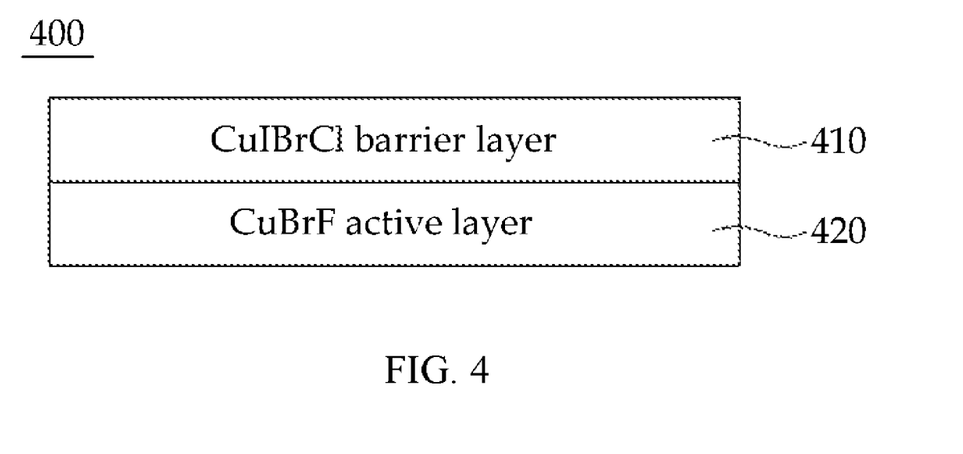
FIG. 4 is a schematic diagram of an illustrative embodiment of a I-VII group compound semiconductor device.

With reference to FIG. 4, a I-VII group compound semiconductor device having a minimized internal polarization field will now be described. FIG. 4 is a schematic diagram of an illustrative embodiment of a I-VII group compound semiconductor device.

In some embodiments, as depicted in FIG. 4, a I-VII group compound semiconductor device 400 includes a CuBrF active layer 420 (i.e., an active layer composed of CuBrF) and a CuIBrCl barrier layer 410 (i.e., a barrier layer composed of CuIBrCl) disposed on one surface (e.g. a top surface) of CuBrF active layer 420. Alternatively, I-VII group compound semiconductor device 400 may further have at least one additional barrier layers formed under one surface (e.g. a bottom surface) of CuBrF active layer 420. In some embodiments, CuBrF active layer 420 may have a thickness of several nanometers to several hundreds nanometers (nm). In other embodiments, CuBrF active layer 420 may have a thickness of f about 0.1 nm to 300 nm, or about 1 nm to 50 nm.

In some embodiments, CuIBrCl barrier layer 410 may have a thickness of several nanometers to several hundreds nanometers (nm). In other embodiments, CuIBrCl barrier layer 410 may have a thickness of about 0.1 nm to 500 nm or about 1 nm and to 100 nm. In some embodiments, a I-VII group compound semiconductor material having a band gap wider than a band gap of a I-VII group compound semiconductor material of the active layer can be selected for the barrier layer.

CuBrF active layer 420 has a smaller band gap than the band gap of CuIBrCl barrier layer 410, thus forming a quantum well in CuBrF active layer 420. For example, the band gap of CuBrF active layer 420 is in the range of about 0.7 eV and 3.4 eV, and the band gap of CuIBrCl barrier layer 410 is in the range of about 0.7 eV and 6.3 eV. The difference between the band gaps of CuBrF active layer 420 and CuIBrCl barrier layer 410 can be controlled by adjusting the composition of CuBrF active layer 420, the composition of barrier layer 410, or the compositions of both CuBrF active layer 420 and CuIBrCl barrier layer 410. In an illustrative example, iodine (I) composition of CuIBrCl barrier layer 410 can be controlled so that CuIBrCl barrier layer 410 has a larger band gap than that of CuBrF active layer 420. For example, the composition of CuIBrCl barrier layer 410 can be controlled to achieve a mole fraction of I composition in the range of about 0.05 to 0.3, assuming that the total mole value of V group compound, that is the sum of mole fractions of I, Br and Cl, is one.

As illustrated with respect to Equation (6) above, the internal polarization field in the quantum well formed in CuBrF active layer 420 can be reduced by controlling the mole fractions of the compositions of CuBrF active layer 420 and CuIBrCl barrier layer 410.

In some embodiments, CuBrF active layer 420 is composed of $CuBr_{0.15}F_{0.85}$ and has a thickness of 3 nm. CuIBrCl barrier layer 410 is composed of $CuI_{0.2}Br_{0.8-y}Cl_y$ and has a thickness of about 3 nm to 15 nm. Variable y, which indicates the mole fraction of a chlorine (Cl) composition of $CuI_{0.2}Br_{0.8-y}Cl_y$ barrier layer 410. Variable y is in the range of about 0 and 0.8, and is controlled such that the sum $P_{PZ}^w + P_{SP}^w$ of piezoelectric and spontaneous polarizations in CuBrF active layer 420 and the sum $P_{PZ}^b + P_{SP}^b$ of piezoelectric and spontaneous polarizations in CuIBrCl barrier layer 410 are substantially the same. The cancellation of the sum of piezoelectric and spontaneous polarizations between the quantum well and CuIBrCl barrier layer 410 makes a total internal polarization field in CuBrF active layer 420 substantially zero as illustrated with reference to Equation (6) above.

The mole fractions of I, Br and Cl compositions of CuIBrCl barrier layer 410 can be controlled to accomplish zero internal polarization field. In some embodiments, CuIBrCl barrier layer 410 can have a composition of $CuI_{y1}Br_{1-y1-y2}Cl_{y2}$ ($0 \leq y1+y2 \leq 1$). Variables y1 and y2 denote the mole fractions of I and Cl compositions, respectively. The subtraction of the sum of y1 and y2 from one (1), that is, 1−y1−y2, denotes the mole fraction of Br composition of CuIBrCl barrier layer 410. In some embodiments, variable y1 can be in the range of about 0.01 and 0.4, and variable y2 can be in the range of about 0.2 and 0.35, in order to reduce the internal polarization field or accomplish the zero internal polarization field.

The composition control can be performed for CuBrF active layer 420. In some embodiments, while the mole fractions of I, Br and Cl compositions of CuIBrCl barrier layer 410 are fixed to a certain number, the mole fractions of Br and F compositions of CuBrF active layer 420 can be adjusted to accomplish the zero internal polarization field. In this case, CuBrF active layer 420 is composed of $CuBr_xF_{1-x}$ ($0 \leq x \leq 1$).

Variable x indicates the mole fraction of Br composition, and the subtraction of x from one (1), i.e. 1−x, indicates the mole fraction of F composition of CuBrF active layer 420. Variable x can be adjusted to reduce the internal polarization field in CuBrF active layer 420 or accomplish the zero internal polarization field in CuBrF active layer 420. In some embodiments, variable x can be in the range of about 0.03 and 1. As an illustrative example, variable x can be selected to be one (1). In this case, active layer 420 is composed of CuBr. CuBr has an excitonic binding energy of about 108 meV which is much larger than that of ZnO. Accordingly, by selecting one as a value of x, active layer 420 can have a large excitonic binding energy and thus semiconductor device 400 can have a high optical gain.

The composition control can be performed for both CuBrF active layer 420 and CuIBrCl barrier layer 410. For example, CuBrF active layer 420 can have a composition of $CuBr_xF_{1-x}$ ($0 \leq x \leq 1$) and CuIBrCl barrier layer 410 can have a composition of $CuI_{y1}Br_{1-y1-y2}Cl_{y2}$ ($0 \leq y1+y2 \leq 1$). As described in the examples above, variable x indicates the mole fraction of Br composition of CuBrF active layer 420, and variables y1 and y2 indicates the mole fractions of I and Cl compositions of CuIBrCl barrier layer 410, respectively. Variables x, y1 and y2 can be adjusted to reduce the internal polarization field in CuBrF active layer 420 or accomplish substantially the zero internal polarization field in CuBrF active layer 420. For example, variables x, y1 and y2 can be in the ranges of about 0.03 and 0.5, about 0.01 to 0.4, and about 0.2 and 0.35, respectively.

In some embodiments, a method for fabricating a semiconductor device is provided. FIGS. 5(a)-(e) are schematic diagrams of an illustrative embodiment of a method for fabricating a semiconductor device 500.

Figure 5A:
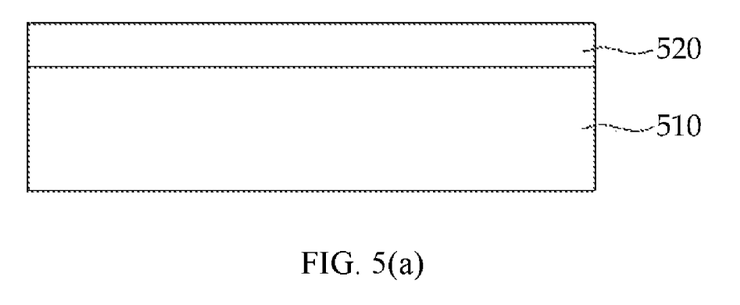
FIGS. 5(a)-(e) are schematic diagrams of an illustrative embodiment of a method for fabricating a semiconductor device.

As depicted in FIG. 5(a), a substrate 510 is prepared. Substrate 510 may be composed of a C-face (0001) or A-face (1120) oriented sapphire ($Al_2O_3$). Alternatively, substrate 510 may include, without limitation, silicon (Si), silicon carbide (SiC), spinel (MgAl2O4), aluminum nitride (AlN), gallium nitride (GaN), or aluminum gallium nitride (AlGaN). A buffer layer 520 can be optionally disposed on one surface (e.g. a top surface) of substrate 510. The material for buffer layer 520 is not limited to the aforementioned I-VII group, but may also include any material that establishes good structural quality. Buffer layer 520 can have a thickness of about 0.1 µm to 300 µm.

Figure 5B:
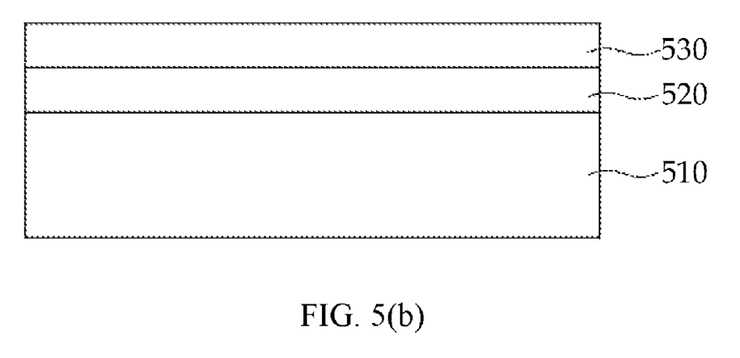

A lower barrier layer 530 may be disposed on a top surface of buffer layer 520, as depicted in FIG. 5(b). Lower barrier layer 530 can include a I-VII group compound semiconductor material. Suitable materials and thickness for lower barrier layer 530 are substantially the same as the materials and thickness described above for lower barrier layer 130. Lower barrier layer 530 can be doped with an n-type dopant or a p-type dopant in order to provide carriers to an active layer 540 which will be disposed on a top surface of lower barrier layer 530. In some embodiments, the n-type dopant may include, without limitation, nitrogen (N), phosphorus (P), arsenic (As), stibium (Sb), or bismuth (Bi). The p-type dopant may include, without limitation, boron (B), aluminum (Al), gallium (Ga), or indium (In). Lower barrier layer 530 can be formed by using any deposition techniques known in the art, such as radio-frequency (RF) magnetron sputtering, pulsed laser deposition, metal organic chemical vapor deposition (MOCVD), molecular beam epitaxy, and radio-frequency plasma-excited molecular beam epitaxy, without limitation. The composition of lower barrier layer 530 can be adjusted by controlling the amount of precursor gases provided to a deposition device (e.g. MOCVD) or by controlling a processing temperature or processing time.

Figure 5C:
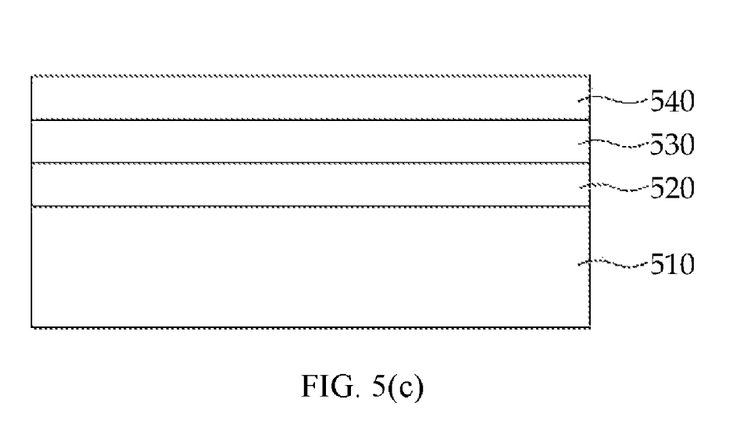

As depicted in FIG. 5(c), active layer 540 is disposed on the top surface of lower barrier layer 530. Active layer 540 can include a I-VII group compound semiconductor material. Suitable materials and thickness for active layer 540 is substantially the same as the materials and thickness described above for active layer 120. Active layer 540 can be formed by using any of the aforementioned deposition techniques.

Figure 5D:
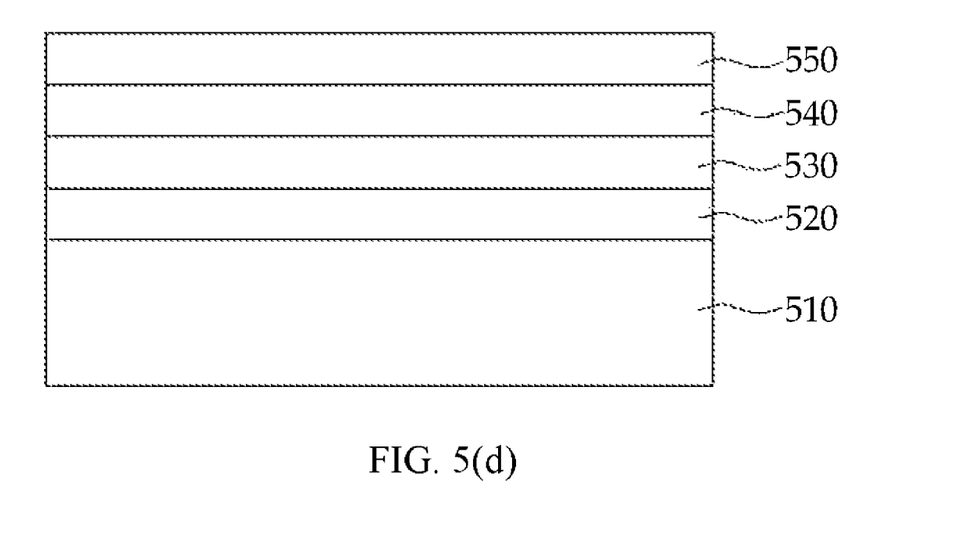

In some embodiments, an upper barrier layer 550 may be disposed on a top surface of active layer 540, as depicted in FIG. 5(d). Suitable materials and thickness for upper barrier layer 550 are substantially the same as the materials and thickness described above for upper barrier layer 110. Upper barrier layer 550 can be doped with an n-type dopant or a p-type dopant that is opposite to the doping type of lower barrier layer 530. As an example, upper and lower barrier layer 550 and 530 can have an n-type and p-type, respectively, or vice versa. Materials of the n-type dopant and p-type dopant for upper barrier layer 550 are substantially the same as the materials of the n-type dopant and p-type dopant described for lower barrier layer 530. Upper barrier layer 550 can be formed by using any of the aforementioned deposition techniques.

In some embodiments, lower barrier layer 530 or upper barrier layer 550 can be selectively formed on active layer 540. For example, semiconductor device 500 can have lower barrier layer 530 disposed on a bottom surface of active layer 540, upper barrier layer 550 disposed on a top surface of active layer 540, or both lower and upper barrier layers 530 and 550 disposed on bottom and top surfaces of active layer 540, respectively.

As described above, the I-VII group compound semiconductor materials for active layer 540 and/or upper and lower barrier layers 550 and 530 can be selected such that active layer 540 has a narrower band gap than those of upper and lower barrier layers 550 and 530. This band gap difference forms a quantum well in active layer 540.

Figure 5E:
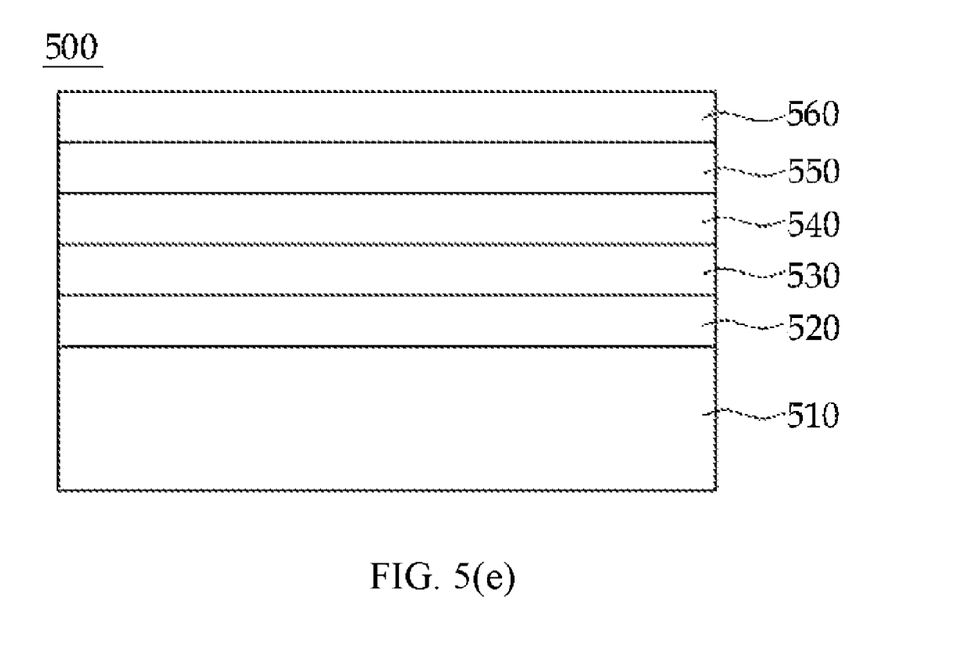

As depicted in FIG. 5(e), an upper electrode 560 is disposed on a top surface of upper barrier layer 550. In some embodiments where upper barrier layer 550 is not disposed on active layer 540, upper electrode 560 can be disposed directly on active layer 540. Upper electrode 560 can include a conductive material such as an n-type doped semiconductor material, a p-type doped semiconductor material, or a metal. For example, upper electrode 560 can include, without limitation, Al, Ti, Ni, Au, Ti/Al, Ni/Au, Ti/Al/Ti/Au, or an alloy thereof. Upper electrode 560 can be formed to have a thickness of about 1 nm to 300 nm, or a thickness of about 5 nm to 50 nm. Upper electrode 530 may be formed by using any techniques know in the art, such as sputtering, electroplating, e-beam evaporation, thermal evaporation, laser-induced evaporation, and ion-beam induced evaporation, without limitation.

Accordingly, a I-VII semiconductor device in accordance with one embodiment can reduce an internal polarization field in a quantum well by forming an upper and/or lower barrier layer of I-VII group compound on at least one active layer of I-VII group compound. Further, the I-VII group compound semiconductor device can reduce the internal polarization field in the quantum well by controlling the mole fractions of the I-VII group compound in the active layer, the upper barrier layer, and/or the lower barrier layer. Through the reduction of the internal polarization field in the quantum well, an optical matrix element of the active layer is enhanced, a relaxation time of electrons or holes in the active layer is reduced, and the Fermi function difference in the active layer is enhanced. Accordingly, an excitonic binding of electron-hole pairs is strengthened and thus an optical gain of the I-VII group compound semiconductor device is significantly enhanced.

In some embodiments, a photo-electric conversion device, an optoelectronic device, or a quantized electronic device in which the I-VII semiconductor device described above is installed can be provided. For example, a short wavelength emitter, a photo detector, a laser, a high electron mobility transistor, or a light emitting device can include the semiconductor device. The I-VII semiconductor device includes at least one active layer and at least one barrier layer disposed on at least one surface of the active layer. Each of the active layer and the barrier layer is composed of a I-VII group compound semiconductor material. The barrier layer has a wider band gap than that of the active layer.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A semiconductor device comprising:
   at least one active layer composed of a first compound; and
   at least one barrier layer composed of a second compound and disposed on at least one surface of the at least one active layer,
   wherein an energy band gap of the at least one barrier layer is wider than an energy band gap of the at least one active layer,
   wherein the first and/or second compounds are selected to strengthen an excitonic binding between an electron and a hole in the at least one active layer,
   wherein the second compound comprises CuFCl, CuBrF, CuFI, CuClBr, CuClI, CuBrI, AgFCl, AgFBr, AgFI, AgClBr, AgClI, AgBrI, AuFCl, AuFBr, AuFI, AuClBr, AuClI, AuBrI, CuFClBr, CuFClI, CuFBrI, CuIBrCl, AgFClBr, AgFClI, AgFBrI, AgClBrI, AuFClBr, AuFClI, AuFBrI, or AuClBrI.

2. The semiconductor device of claim 1, wherein the excitonic binding is strengthened by reducing an internal polarization field in the at least one active layer.

3. The semiconductor device of claim 2, wherein the internal polarization field is reduced by making a sum of piezoelectric and spontaneous polarizations in the at least one active layer and a sum of piezoelectric and spontaneous polarizations in the at least one barrier layer substantially the same.

4. The semiconductor device of claim 1, wherein each of the first and second compounds comprises a I-VII group compound semiconductor material.

5. The semiconductor device of claim 1, wherein the first compound comprises CuF, CuCl, CuBr, CuI, AgF, AgCl, AgBr, AgI, AuF, AuCl, AuBr, AuI, CuFCl, CuBrF, CuFI, CuClBr, CuClI, CuBrI, AgFCl, AgFBr, AgFI, AgClBr, AgClI, AgBrI, AuFCl, AuFBr, AuFI, AuClBr, AuClI, AuBrI, CuFClBr, CuFClI, CuFBrI, CuIBrCl, AgFClBr, AgFClI, AgFBrI, AgClBrI, AuFClBr, AuFClI, AuFBrI, or AuClBrI.

6. The semiconductor device of claim 1, wherein the first compound comprises $CuBr_x F_{1-x}$ ($0 \leq x \leq 1$), and the second compound comprises $CuI_{y1} Br_{1-y1-y2} Cl_{y2}$ ($0 \leq y1+y2 \leq 1$).

7. The semiconductor device of claim 6, wherein x is in the range of about 0.03 and 0.5, y1 is in the range of about 0.01 to 0.4, and y2 is in the range of about 0.2 and 0.35.

8. The semiconductor device of claim 1, wherein the at least one active layer has a thickness of about 0.1 nm to 300 nm, and the at least one barrier layer has a thickness of about 0.1 nm to 500 nm.

9. The semiconductor device of claim 1, wherein the energy band gap of the at least one active layer is in the range of about 0.7 eV and 3.4 eV, and the energy band gap of the at least one barrier layer is in the range of about 0.7 eV and 6.3 eV.

10. The semiconductor device of claim 1, wherein an optical gain of the semiconductor device is substantially identical to or greater than about 8,000/cm.

11. A semiconductor device comprising:
    at least one active layer composed of a first compound; and
    at least one barrier layer composed of a second compound and disposed on at least one surface of the at least one active layer,
    wherein an energy band gap of the at least one barrier layer is wider than an energy band gap of the at least one active layer,
    wherein the first and/or second compounds are selected to strengthen an excitonic binding between an electron and a hole in the at least one active layer, and
    wherein the first compound comprises $CuBr_x F_{1-x}$ ($0 \leq x \leq 1$), and the second compound comprises $CuI_{y1} Br_{1-y1-y2} Cl_{y2}$ ($0 \leq y1+y2 \leq 1$).

12. The semiconductor device of claim 11, wherein x is in the range of about 0.03 and 0.5, y1 is in the range of about 0.01 to 0.4, and y2 is in the range of about 0.2 and 0.35.

* * * * *